(12) United States Patent
Hendricks et al.

(10) Patent No.: US 6,964,294 B2
(45) Date of Patent: Nov. 15, 2005

(54) PASSIVE COOLING SYSTEM FOR A VEHICLE

(75) Inventors: Terry Joseph Hendricks, Arvada, CO (US); Thomas Thoensen, Erie, CO (US)

(73) Assignee: Midwest Research Institute, Kansas City, MO (US)

(*) Notice: Subject to any disclaimer, the term of this patent is extended or adjusted under 35 U.S.C. 154(b) by 0 days.

(21) Appl. No.: 10/670,650

(22) Filed: Sep. 24, 2003

(65) Prior Publication Data

US 2005/0061484 A1 Mar. 24, 2005

(51) Int. Cl.[7] ............................................. B60H 3/00
(52) U.S. Cl. ......................................... 165/41; 165/185
(58) Field of Search ........................... 165/41, 104.21, 165/104.26, 185

(56) References Cited

U.S. PATENT DOCUMENTS

| | | | | |
|---|---|---|---|---|
| 3,618,854 A | * | 11/1971 | Frank ..................... | 237/12.3 B |
| 3,738,702 A | * | 6/1973 | Jacobs .................... | 297/180.15 |
| 4,051,692 A | | 10/1977 | Ku et al. | |
| 4,133,376 A | * | 1/1979 | Eilenberg et al. ...... | 165/104.21 |
| 5,720,339 A | * | 2/1998 | Glass et al. ............ | 165/104.26 |
| 5,806,800 A | * | 9/1998 | Caplin .................... | 244/158 R |
| 5,950,710 A | | 9/1999 | Liu | |
| 6,230,790 B1 | * | 5/2001 | Hemingway et al. ...... | 165/80.4 |
| 6,446,706 B1 | * | 9/2002 | Rosenfeld et al. ............ | 165/46 |

FOREIGN PATENT DOCUMENTS

| | | | | |
|---|---|---|---|---|
| DE | 9110270 U | | 11/1991 | |
| JP | 57-159907 | * | 10/1982 | ................. 165/272 |
| JP | 60-185654 A | | 9/1985 | |
| JP | 2004-58943 | * | 2/2004 | ................... 165/41 |
| JP | 2004-138366 | * | 5/2004 | ................... 165/41 |
| WO | WO 02/092369 | * | 11/2002 | ................... 165/41 |

OTHER PUBLICATIONS

Hendricks, Terry J. et al., Experimental Demonstration of Heat Pipe/Two-Phase Flow Systems for Vehicle Passenger Cabin Cooling, Proceedings of the 2001 International Mechanical Engineering Congress & Exposition, ASME HTD-24404, New York, NY, Nov. 2001.

* cited by examiner

Primary Examiner—Terrell Mckinnon
(74) Attorney, Agent, or Firm—Paul J. White

(57) ABSTRACT

A passive cooling system for a vehicle (114) transfers heat from an overheated internal component, for example, an instrument panel (100), to an external portion (116) of the vehicle (114), for example, a side body panel (126). The passive cooling system includes one or more heat pipes (112) having an evaporator section (118) embedded in the overheated internal component and a condenser section (120) at the external portion (116) of the vehicle (114). The evaporator (118) and condenser (120) sections are in fluid communication. The passive cooling system may also include a thermally conductive film (140) for thermally connecting the evaporator sections (118) of the heat pipes (112) to each other and to the instrument panel (100).

28 Claims, 5 Drawing Sheets

PASSIVE COOLING SYSTEM FOR A VEHICLE

CONTRACTUAL ORIGIN OF THE INVENTION

The United States Government has rights to this invention pursuant to Contract No. DE-AC36-99GO-10337 between the United States Department of Energy and the National Renewable Energy Laboratory, a Division of the Midwest Research Institute.

TECHNICAL FIELD

The application relates generally to a cooling system for a vehicle and more particularly to a cooling system for passively transferring thermal energy from an overheated instrument panel within the vehicle to an external portion of the vehicle.

BACKGROUND ART

Numerous components within a vehicle, i.e., instrument panel, seats, arm rests, etc, absorb a significant amount of solar energy. The most prevalent of these components in this respect is the instrument panel, i.e., IP or dash board, which typically contains an outer layer of polyvinyl chloride (PVC), or like material, having a high energy absorption coefficient and a low thermal conductivity rate. As such, an instrument panel exposed to solar energy, even over a short period of time, may reach temperatures in the 70° C. to 90° C. range during temperate days, especially in areas of high solar intensity, for example in the Southern and Southwestern parts of the United States, in dessert climates like the Middle East and in tropical climates like Brazil.

Thermal absorption by the instrument panel raises several design issues or problems within the vehicle. First of all, the absorbed solar heat puts severe thermal requirements on the material used to make the instrument panel, for example, extreme heat and daily thermal cycling may result in the drying and cracking of the instrument panel and in the fading of the instrument panel color. Damage to the instrument panel requires additional material costs with regard to design and replacement considerations. Second, heat sensitive electronic equipment positioned adjacent to and within the instrument panel may be damaged by the extreme heat and thermal cycling of the instrument panel material, resulting in additional electronics costs with regard to design and replacement considerations. Third, heating of the instrument panel generally results in some level of volatile organic compound release into the vehicle cabin (often associated with an unpleasant smell and in some cases discomfort and nausea). Fourth, release of the absorbed heat from the overheated instrument panel often results in a degrading of the passenger's thermal comfort, especially since the heat often radiates directly at and into the passengers upper body and head. Finally, and perhaps most importantly, thermal absorption puts a significant load on the vehicle's air conditioning system. Studies suggest that an air conditioner compressor, in a temperate part of the United States, must overcome an average of 500 watts of energy to accommodate the heat release from an overheated instrument panel. This increased consumption of energy requires a corresponding increase in fuel consumption by the vehicle and comes with a concomitant increase in the vehicle's emissions. Taken together, the issues associated with solar absorption by the instrument panel and other internal components represent a significant problem in the design and manufacture of a vehicle.

As noted above, air conditioning is one of the prevalent means for overcoming the increased heat associated with an overheated instrument panel. However, the instrument panel has an extremely low thermal conductivity rate, resulting in a very inefficient cooling of the instrument panel. More recently, a blower was integrated into an instrument panel for actively pumping cool air over the overheated surface of the dash board. Although this solution concentrates on cooling the instrument panel and is likely more effective than a passenger compartment air conditioner, it still requires active energy use and hence added fuel consumption and emissions by the vehicle.

Several recent attempts have been made to integrate more passive cooling techniques into the passenger compartment of a vehicle, including installing an energy absorbing windshield and integrating heat pipes into the roof of a vehicle for transfer of the solar energy hitting the roof of the vehicle to the undercarriage of the vehicle. Other attempts have been made by integrating both active and passive cooling techniques into the cooling of an automobile steering wheel and passenger seat. However, neither approach has efficiently abrogated instrument panel overheating and its concomitant problems.

Against this backdrop the present invention has been developed.

SUMMARY OF THE INVENTION

Accordingly, there is a need for a passive cooling system and method that efficiently and inexpensively reduces the heat from an instrument panel.

In accordance with a preferred embodiment, a passive cooling system for a passenger compartment of a vehicle has an internal component, for example an instrument panel, at a first temperature and an external portion of the vehicle at a second temperature lower than the first temperature. A heat pipe or pipes containing a liquid under pressure communicates between the internal component and the external portion of the vehicle. The heat pipe has an evaporator section located in the component and a condenser section located at the external portion of the vehicle, so that heat at the component causes the liquid in the evaporator section to vaporize and move to the condenser section and condense. The cycle of evaporation and condensation results in the passive transfer of heat from the component to the external portion of the vehicle.

These and various other features as well as advantages which characterize the present invention will be apparent from a reading of the following detailed description and a review of the associated drawings.

DETAILED DESCRIPTION

An embodiment of the present invention is a system for passively transferring heat from an overheated internal component of the vehicle, for example an instrument panel, to an external portion of the vehicle, for example a side body panel. The absorbed solar heat is transferred by one or more heat pipes embedded in the component where the heat pipes extend to an external portion of the vehicle.

For purposes of this disclosure, the inventive features of the cooling system will be illustrated in a vehicle's instrument panel, but it is envisioned that embodiments of the present invention may be implemented in other internal components within a vehicle, for example, arm rests, seats, etc, or any other component that absorbs solar energy within the vehicle's passenger compartment.

A typical vehicle, e.g., car, truck, tractor, etc, has an instrument panel containing electronic equipment involved in the operation of that vehicle. Generally, the instrument panel includes a scaffolding covered by a thermal plastic polymer skin, for example, polyvinyl chloride (PVC). The scaffolding/PVC shell define an internal chamber for housing electronic equipment used to operated the vehicle, while gauges and other readable dials are embedded in the durable PVC skin to communicate relevant information to the operator.

Figure 1:
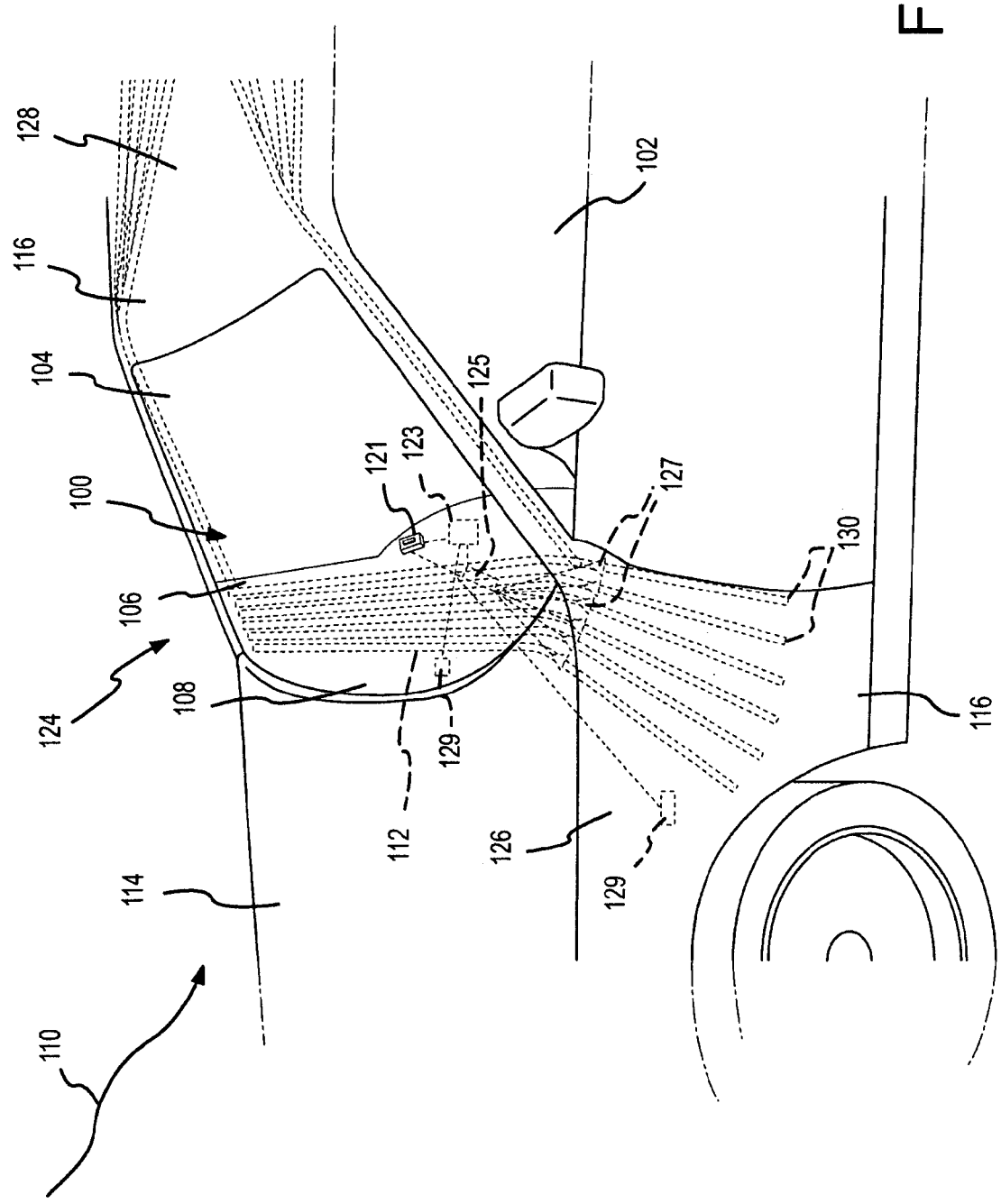
FIG. 1 illustrates one embodiment of the passive heat transfer system of the present invention.

The instrument panel 100 typically spans the width of the passenger compartment 102 at a position adjacent to and below the front windshield 104, as is shown in FIG. 1. A top surface 106 of the instrument panel 100 generally adjoins the bottom edge 108 of the windshield 104 and extends inwardly below the windshield. The proximity and positioning of the top surface 106 of the instrument panel 100 to the front windshield facilitates the absorption of solar energy, depicted by arrow 110. The absorbed solar energy 110 causes the instrument panel to become heated or overheated, i.e., heated above the temperature of a non-solar exposed instrument panel, and consequently for the passenger compartment 102 to become heated.

Thermal plastic polymers, e.g., PVC, are suitable materials for forming an outer structural layer of the instrument panel 100. Thermal plastic polymers are durable, resist moisture and are readily compounded into appropriate rigid forms. However, thermal plastic polymers, and PVC in particular, also have high heat absorption coefficients and low thermal conductivity, making the material a ready absorber and retainer of solar energy. For example, an instrument panel is generally much hotter than the air temperature outside the vehicle, making it not unusual for an instrument panel to reach temperatures in the 50_ to 70_C. range, and as high as 85_C. in certain parts of the world. It is this phenomenon of solar heating within the vehicle 114, and in particular solar heating of the instrument panel 100, that embodiments of the present invention are aimed at minimizing. As will be discussed in greater detail below, heat pipes 112 or other thermal conductors are used to passively transfer heat from the instrument panel 100, to a cooler external portion 116 of the vehicle 114.

Figure 2:
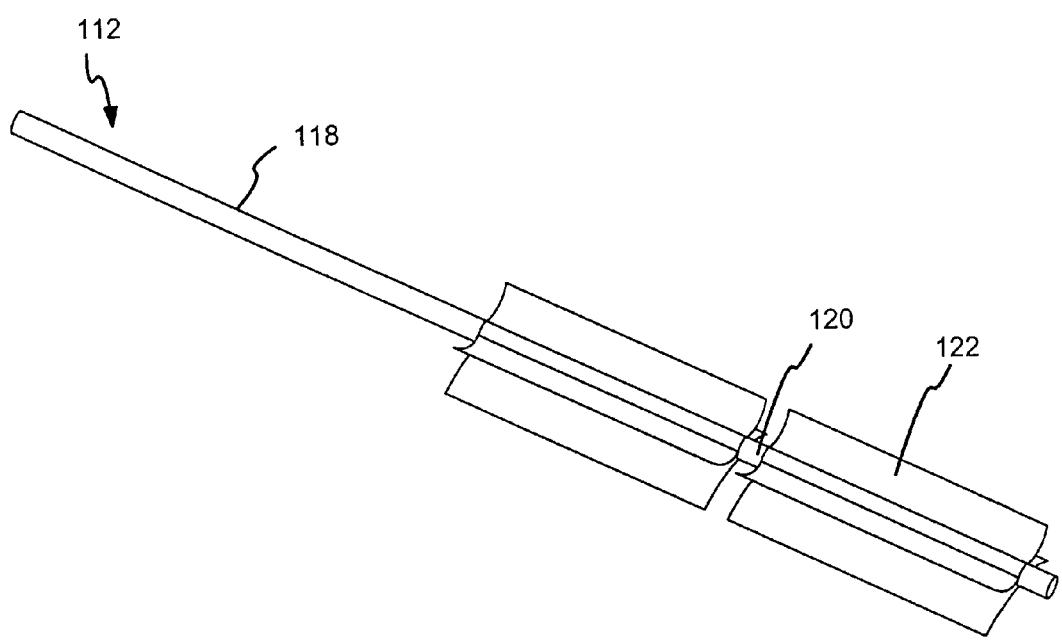
FIG. 2 illustrates one embodiment of a heat pipe in accordance with the present invention.

A heat pipe 112 is a flexible metal tube containing a small amount of liquid in a partial vacuum, where the liquid is under its own pressure. (see FIG. 2). A heat pipe 112 may have any number of different cross sectional shapes, including but not limited to, cylindrical, rectangular, diamond, oblong, etc, and have any number of different diameters, from micrometers, i.e., a microtube, to more conventional sizes, like ⅛ inch to ½ inch. Each heat pipe 112 is composed of at least two sections, an evaporator section 118 and a condenser section 120. Heat absorbed anywhere along the evaporating section 118 causes the liquid inside the heat pipe to boil and enter a vapor state. The liquid-to-vapor phase change absorbs energy associated with the latent heat of vaporization, resulting in a removal of heat from the area adjacent the evaporator section of the heat pipe 112. Vapor moves along channels or grooves inside the pipe to a portion of the pipe having a lower vapor pressure, i.e., the cooler condenser section, where the vapor condenses back to its liquid phase. The condensation of vapor back to liquid is accompanied by the vapor giving up the latent heat of vaporization, i.e., there is a decrease in the potential energy of the fluid and heat is released. The released heat dissipates to the cooler external surfaces of the vehicle. A metal plate 122 or plates may be attached to the condenser section 120 to facilitate the dissipation of heat from the heat pipes 112. A wick-like capillary material (not shown) absorbs the liquid wherever the vapor has condensed within the pipe 112, transferring the liquid back toward the evaporator section 118 of the pipe via capillary pressure. Heat pipes, therefore, act as passive one-way transferers of heat from the overheated evaporator section to the cooler condenser section of the pipes.

As is evident from the discussion above, the operating characteristics of a heat pipe 112 are dependent, among other things, on the heat of vaporization of the liquid within the heat pipe. Heat pipes are generally placed in one of three categories dependent on the operating temperature range of the fluid within the pipe. Cryogenic heat pipes generally operate at temperatures between about 10_ and about 150_K, low temperature heat pipes operate at temperatures between about 150_ and about 800_K and high temperature heat pipes operate at temperatures between about 800_ and 5,000_K. Note that several other design properties go into choosing a heat pipe, including, the liquid's density, viscosity, thermal conductivity, surface tension and wet ability.

Again referring to FIG. 1, a heat transfer system 124 in accordance with one embodiment of the invention is illustrated, where heat pipes 112 are embedded within the instrument panel 100 to passively transfer heat from an overheated instrument panel to an external portion 116 of the vehicle, for example, to the side body panel 126 or roof 128 of a car. Preferably, the evaporator section 118 of each heat pipe extends the entire length of the instrument panel 106 and is in proximity to the top surface 106 of the instrument panel 100. (see below).

The condenser section 120 is in fluid communication with the evaporator section and may be located at any cooler (see below) external portion of the vehicle. In one embodiment of the present invention, the condenser sections 120 of the heat pipes 112 extend downwardly from the evaporator section 118 and are positioned in proximity to an outer portion of the vehicle side body panel 126. Note that since the liquid is condensing below the evaporator section of each heat pipe, in a gravity field there is a practical limit to the distance the liquid can return via the wick-like material in the heat pipes. Preferably, in a gravity field the bottom end 130 of the condenser section 120 is no farther than 18 to 20 inches below the evaporator section 118, and more preferably the condenser section is no farther than 12 to 14 inches below the evaporator section. In an alternative embodiment, the condenser section of the heat pipes is positioned on the roof 128 of the vehicle. An adiabatic section of heat pipe 112 connects the evaporator section in the instrument panel to the condenser section in the roof. Here the condenser section is not restricted in length as liquid is encouraged by gravity to return to the evaporator section of the heat pipes. Note that the condenser section may be located at other external portions of the vehicle, for example, the undercarriage, being limited only by design feasibility and cost. Also note that the temperature difference between the instrument panel and the external portion of the vehicle need only be 5 to 10_C., making a large portion of the vehicle a suitable target for employment of the condenser section.

Heat pipe liquids for use with the present invention must have a fluid saturation pressure between 0.1 atmosphere and about 20 atmospheres for the instrument panel temperature range. As such, low temperature heat pipes are used with embodiments of the present invention. Preferable liquids for use with the present invention include, but are not limited to, water, methanol and fluorocarbon. Preferable liquids may also be mixtures of the above three liquids, for example using a methanol/water mix. Note also that these liquids have preferable density, viscosity, wet ability, etc, characteristics for transferring the heat from the evaporator section of the heat pipe to the condenser section of the heat pipe in the context of a vehicle.

Additionally, there are several liquids that have the correct range of vapor pressures, density, etc, for use with the present invention, but that represent a safety hazard to the vehicle operator, or vehicle bystander. These liquids include, but are not limited to, benzene, methane and ammonia. For these reasons, methane, ammonia and benzene should not be used in conjunction with this invention.

A compatible metal must be utilized with each liquid in a heat pipe, therefore, the heat pipes of the present invention must be made from a water, methanol or fluorocarbon compatible metal. For example, a heat pipe having water as the liquid may only be composed of steel, copper, nickel, inconel, monel or titanium. A heat pipe-utilizing methanol may only be composed of stainless steel, iron, copper, brass, silica or nickel. And a heat pipe having a fluorocarbon as the liquid may be composed of aluminum. Also note that where a mixture of liquids are used in a heat pipe, both liquids should be compatible with the metal, i.e., nickel or copper for a methanol/water mixture.

Preferable heat pipes for use with the present invention contain water and are composed of copper. Pipes have a generally circular, rectangular or triangular cross section, having a diameter of a few thousands of an inch to half an inch.

The heat pipe wick for use with embodiments of the present invention should be a porous media having low flow resistance. Preferable materials include, but are not limited to, woven fiberglass, wound or stacked screens, sintered fibers, and packed beds and powers. Additionally, the wick may be a series of small capillaries for example, etched or milled grooves.

Figure 3:
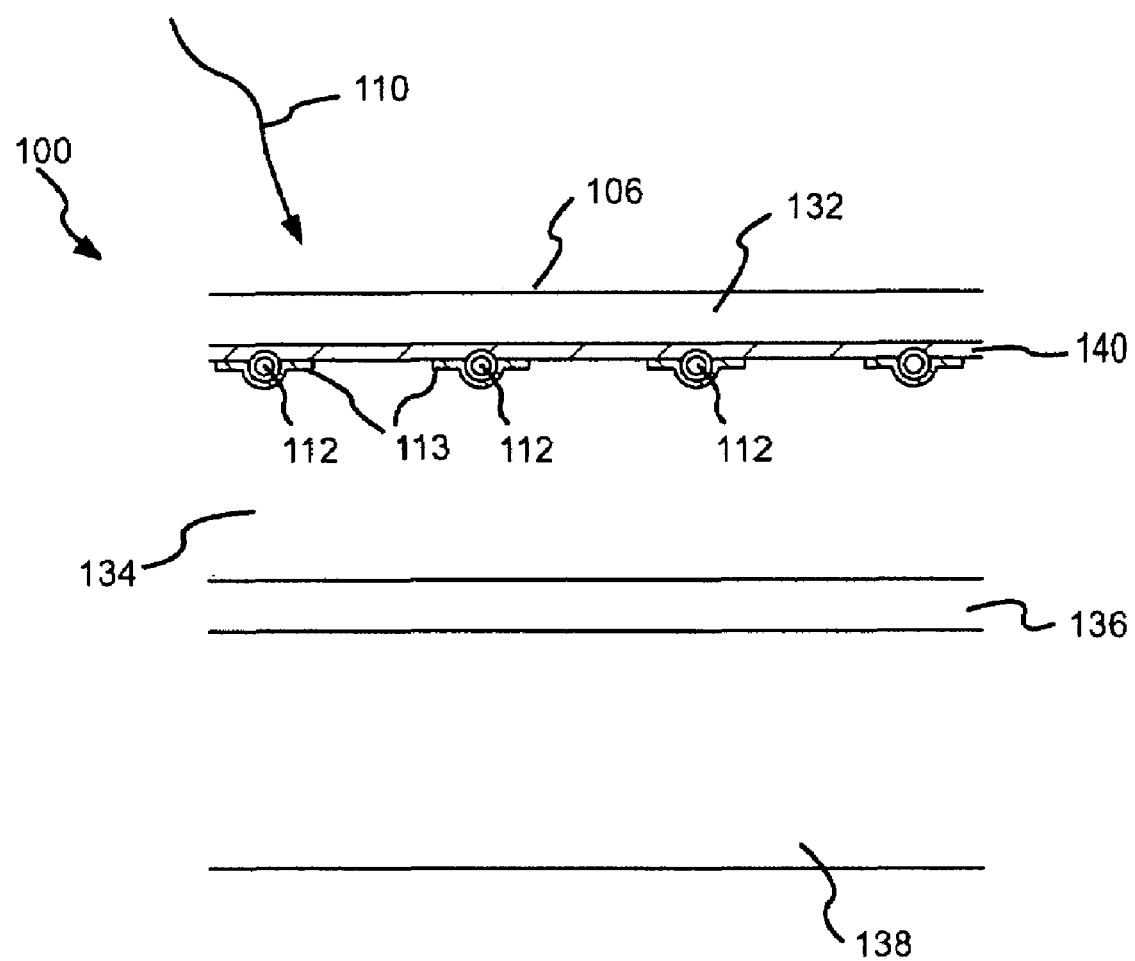
FIG. 3 is a representative cross sectional view of an instrument panel incorporating an embodiment of the passive heat transfer system of the present invention.

As shown in FIG. 3, the instrument panel 100 is composed of a series of layers, the top layer being a 1 mm or so thick outer thermoplastic layer 132, e.g., PVC skin, on top of a 8 to 10 mm polyurethane foam layer 134, below the polyurethane is a 2 to 3 mm thick thermoplastic layer 136, covering an area 138 for air conditioner ducting and metal scaffolding. Solar energy, shown as arrow 110, transmitted to the instrument panel 100 tends to be absorbed and trapped at the top PVC layer 132 due to the materials high absorption coefficient and low thermal conductivity. As such, heat pipes 112 in accordance with the present invention are embedded in or adjacent to the PVC outer layer 132 of the instrument panel so that trapped heat within the PVC layer is generally transferred in a one way direction from the PVC layer 132 to the evaporator section 118 of the heat pipes 112 and onto the condenser section 120 of the heat pipes 112. Preferably, the heat pipes 112 are as close to the top surface 106 of the PVC layer 132 as practical so to facilitate the transfer of heat out of the layer.

There are several embodiments for embedding heat pipes 112 within or adjacent the thermoplastic layer 132 of the instrument panel 100. In one embodiment, the evaporator section 118 of each heat pipe 112 is directly integrated or adhered at the PVC layer 132. Structural brackets (e.g.. brackets 113 shown in FIG. 3) may be used around each heat pipe 112 to allow for differential thermal expansion between the dissimilar materials. In one such embodiment the evaporator section 118 of each heat pipe 112 is glued to the bottom of the PVC layer 132 with a thermal adhesive. Preferably, the number of heat pipes adhered to the bottom surface of the PVC layer 132 is sufficient to extend substantially across the width of the layer 132. In this regard, the heat pipes may also be placed into grooves or snaps formed along the bottom surface of the PVC layer 132, noting again that the grooves or snaps should allow for the differential thermal expansion between the heat pipes 112 and PVC materials. In some embodiments, the PVC is formed around the heat pipes.

In another embodiment, the evaporator section of the heat tubes is formed within the PVC layer 132 by milling microtubes throughout the layer (not shown). Each microtube extends the length of the instrument panel 100 and has a micrometer sized diameter. Microtubes can be formed as layers (side-by-side) across the PVC layer 132 or as a bundle (grouped) of microtubes across the PVC layer. The milled microtube size heat pipes may be positioned toward the top surface 106 of the PVC layer for maximal heat removal without effecting the surface contour of the top surface 106 of the instrument panel.

In one embodiment of the present invention, the microtubes in the PVC layer of the instrument panel are connected to condenser sections in the external portion of the vehicle by a tube manifold. Alternatively, the condenser sections of the heat pipes would extend to the instrument panel and provide a short section of heat pipe at which the milled microtubules would come together and connect.

Figure 4:
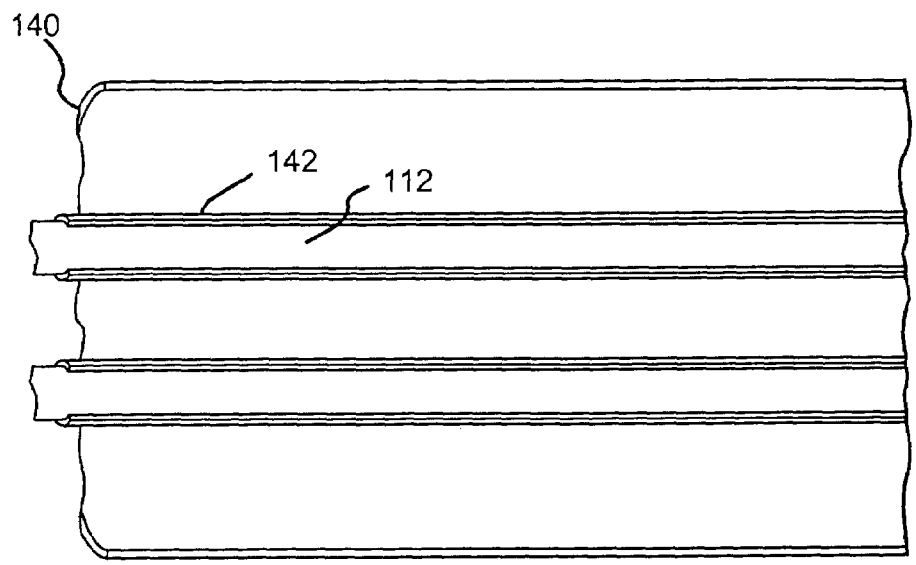
FIG. 4 illustrates one embodiment of the heat pipes secured to a thermally conductive film in accordance with the present invention.

In another embodiment FIG. 4, the evaporator sections 118 of a plurality of heat pipes 112 are connected to each other by a thermally conductive film 140 or platform. Heat pipes embedded at the bottom surface of the PVC layer are interspersed across the PVC layer. The thermally conductive film 140 extends between each heat pipe to funnel heat from the PVC layer 132 to the heat pipes 112. Preferably, the film 140 directly connects the evaporator section 118 of the heat pipes with the PVC layer 132, where the film 140 is attached to the bottom of the PVC layer. Heat trapped in the PVC layer moves through the thermally conductive film to the evaporator sections of each heat pipe. As such, the thermally conductive film 140 forms a funnel to direct heat to the thermally connected heat pipes. Preferably, the thermally conductive film substantially extends the length of the instrument panel and between each heat pipe, making maximal contact with the PVC layer. The film 140 may be one elongated piece or several inter-connected pieces. The film 140 may be a metal, ceramic, carbon fiber composite, diamond, carbon foam, etc. Preferable metals include, but are not limited to, copper, aluminum, molybdenum, gold, nickel, stainless steel, niobium, beryllium, cobalt, boron, bismuth, indium, magnesium, palladium, platinum, iron, iridium, bronze, silver, tin, titanium, tungsten, zinc, etc. The film is typically between 1 and 40 mils in thickness and is preferably between 10 and 30 mils in thickness. Note that thicker films may be used but are of diminishing value. Preferable ceramics include carbide, alumina and aluminum nitride.

With regard to attachment of the film 140 to the PVC layer 132, preferably, a thermal adhesive is sandwiched between the film and the PVC layer. Preferable thermal adhesives include, but are not limited to, Omega bond 101 (Stamford, Conn.), etc. Alternatively, the film may be secured to the PVC using any number of conventional attachment means, for example, screws, rivets, etc.

There are several embodiments for securing the heat pipes 112 to the thermally conductive film 140. In one embodiment, the heat pipes 112 are secured within an elongated metal bracket or snap 142 interposed between or on the metal film 140. (see FIG. 4). The metal brackets 142 are thermally conductive and may be composed of the same metals as used to form the film. Preferably, each bracket 142 is inwardly biased to snap the heat pipe into thermal contact with the film 140 and/or PVC layer 132, while providing sufficient space to accommodate the thermal expansion and contraction of the heat pipe during the absorption and dissipation of heat. Bracket 142 engaged heat pipes 112 may be coated with a thermally conductive grease (not shown) to maximize the thermal contact between the heat pipe and the metal bracket and thus facilitate the movement of heat from the PVC layer to the film, bracket(s) and heat pipes.

The number of brackets/heat pipes secured across the film is variable and dependent, at least to some extent, upon the diameter and cross-sectional shape of the heat pipes and the amount of heat to be removed from the PVC layer. Preferably, there are between 6 and 12 brackets/heat pipes per instrument panel.

Other designs for embedding the heat pipes 112 within or adjacent the PVC layer are envisioned to be within the scope of the present invention, as well as embedding heat pipes in other layers of the instrument panel. For example, heat pipes 112 may be embedded in the polyurethane layer 138, or in some circumstances, may be embedded in the thermoplastic layer 136. In other embodiments, heat pipes 112 may be embedded in several layers of the instrument panel, for example, heat pipes 112 embedded in the PVC layer 132 and polyurethane layer 138. A joint or other flexible member transitions the evaporator section 118 of each embedded heat pipe 112 to the condenser section 120 of each heat pipe 112. Condenser sections 120 may extend from either side of the PVC embedded evaporator section 118, so that a condenser section 120 is located on one or both side body panels of the vehicle. In some embodiments, the condenser section 120 has the same film and bracket structure as in the evaporator section but is directed along the inside of the side body panel or in some embodiments along the roof.

An alternative embodiment of the present invention includes heat pipes having a valve or valves 127 for sealing the evaporator section 118 from the condenser section 120. A closed valve 127 disrupts the transfer of heat from the instrument panel to the external environment by preventing the vapor from leaving the evaporator section of the heat pipes. As such, the vehicle's operator could manually control the transfer of heat from the instrument panel i.e., on a cooler day keep the absorbed solar energy within the vehicle passenger compartment. As shown in FIG. 1, a manual switch 121 may provided to allow an operator to manually close a valve, such as via valve trigger or controller 125 linked to the valves 127. Alternatively, the valve or valves 127 could be triggered to close at certain preset instrument panel temperatures, or, alternatively, at certain preset passenger compartment air temperatures. A sensor 129 within the instrument panel or within the passenger compartment would sense the temperature and signal a computer or other decision making device 123 (or, the trigger/controller 125) to open or close the valve as appropriate. For example, a valve 127 within each heat pipe would automatically close if the air temperature in the passenger compartment dropped below 20° C. and reopen if the temperature elevated above 20° C.

Figure 5:
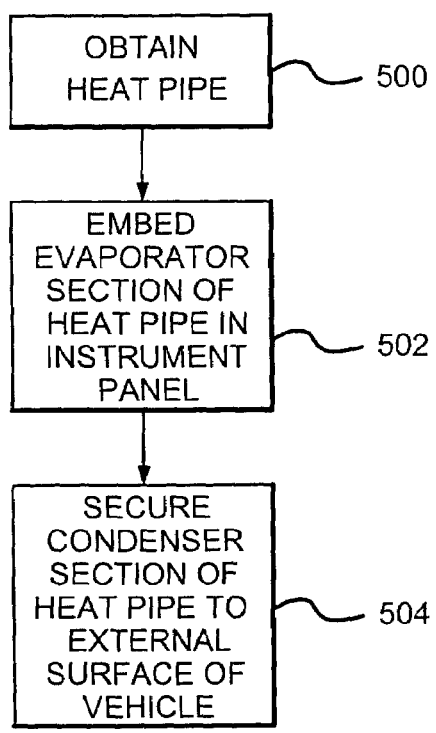
FIG. 5 is a flow diagram illustrating one embodiment of a method for passively cooling an instrument panel in accordance with the present invention.

Finally, embodiments of the present invention may be envisioned as a method of heat removal from a vehicle passenger compartment, as is shown in FIG. 5. In operation 500, one or more heat pipes is obtained. Each heat pipe has an evaporator section and a condenser section and contains an appropriate liquid. Heat pipes have the correct dimensions for inclusion within a vehicle instrument panel. Once operation 500 has concluded, operation 502 assumes control. In operation 502, the evaporator section of the one or more heat pipes are embedded in the instrument panel. Once operation 502 has concluded, operation 504 assumes control. In operation 504, the condenser section of the one or more heat pipes are secured to an external surface of the vehicle.

EXAMPLES

The following examples are provided to illustrate the invention only, and should not be construed as limiting the scope of the invention.

Example 1

Heat Pipes Passively Cool an Instrument Panel

An instrument panel having a heat pipe embedded portion and a non-heat pipe embedded portion was exposed to solar energy to determine the effects heat pipes have on cooling an instrument panel.

A vehicle simulator having the passenger compartment dimensions, including windshield and instrument panel size and shape, of a Plymouth Breeze, was equipped with an instrument panel having a heat pipe embedded portion and another portion absent of heat pipes. The vehicle simulator was exposed to a solar track during which time the temperature of each portion of the instrument panel was followed and plotted as a function of time of day, as shown in FIG. 6.

In particular, a series of water containing, 0.5 inch diameter copper heat pipes were embedded 1.6 mm below the top surface of the instrument panel within the PVC skin. The evaporator section extended from approximately the middle of the instrument panel to one edge of the instrument panel. Each evaporator section was continuous with a 12 inch condenser section positioned outside the side body panel of the vehicle simulator. The other half of the instrument panel was essentially the same but had no embedded heat pipes. The vehicle simulator was exposed to solar intensity between about 200 and about 525 W/m² between the hours of 9:53 am and 3:23 pm (a period of 5 hours and 30 daytime minutes). Continuous temperature readings were made on the two portions of the instrument panel using type-K (chromel-alumel) thermocouplers. As shown in FIG. 6, data was plotted as a function of test time 600, instrument panel temperature 602 and solar intensity 604. A solar track 606 indicates the day time solar intensity, and data plots 608 and 610 indicate the instrument panel temperature for the portion of the panel having heat pipes and the portion of the instrument panel not having heat pipes, respectively.

Figure 6:
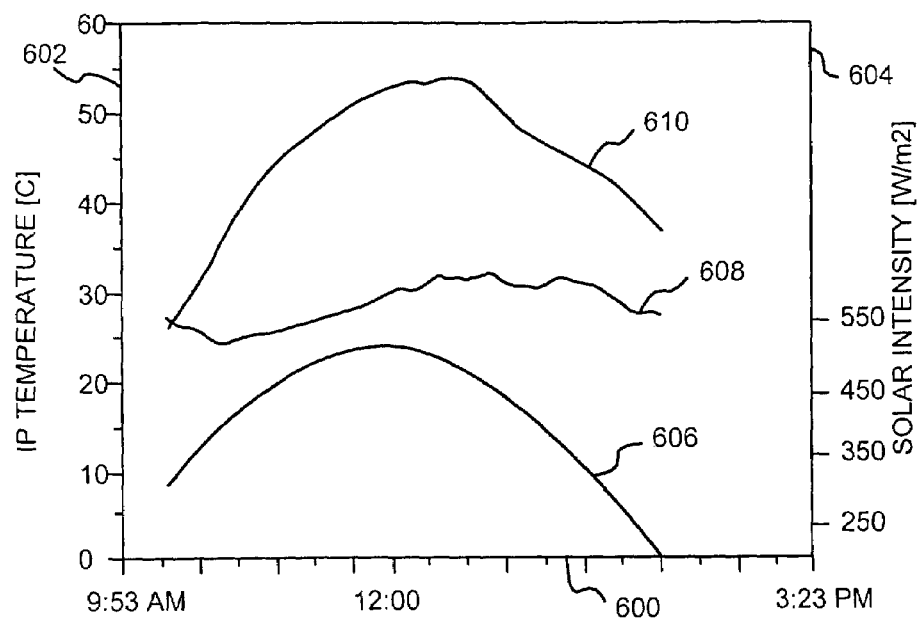
FIG. 6 graphically illustrates the temperature difference between an instrument panel and an instrument panel incorporating an embodiment of the passive heat transfer system of the present invention.

Results:

As shown in FIG. 6, the portion of the instrument panel having embedded heat pipes showed a markedly lower mean temperature over the course of the solar track than did the portion of the instrument panel having no heat pipes. On average, the heat-pipe containing portion was about 20_C. cooler than the identically treated non-heat pipe containing portion of the instrument panel. It is further noted that the heat pipe containing portion of the instrument panel was essentially isothermal throughout the test period while the non-heat pipe containing portion of the instrument panel showed a large thermal cycle going from to upper 20's in the morning, reaching the mid 50s during mid-day and dropping back to the low 30's in the late afternoon.

The data illustrates the passive cooling properties that one embodiment of the present invention has on a standard sized instrument panel over the course of a day.

Example 2

Heat Pipes Lower the Breath Level Temperature Within a Vehicle's Passenger Compartment An instrument panel having a heat pipe embedded portion and a non-heat pipe embedded portion was exposed to solar energy to determine the effects heat pipes have on the thermal environment of the passenger compartment.

A vehicle simulator having the passenger compartment dimensions, including windshield and instrument panel size and shape, of a Plymouth Breeze, was equipped with an instrument panel having a heat pipe embedded portion and a non-heat pipe embedded portion. The vehicle simulator was exposed to a solar track during which time the air temperature above each portion of the instrument panel was followed and plotted as a function of time of day, as shown in FIG. 7.

In particular, a series of water containing, 0.5-inch diameter copper heat pipes were embedded 1.6 mm below the top surface of the instrument panel within the PVC skin. The evaporator section extended from approximately the middle of the instrument panel to one edge of the instrument panel. Each evaporator section was continuous with a 12-inch condenser section positioned in the side body panel of the vehicle simulator. The other half of the instrument panel was essentially the same but had no embedded heat pipes. The vehicle simulator was exposed to solar intensity between about 200 and about 525 W/m² between the hours of 9:53 am and 3:23 pm on Jan. 5, 2000 (a period of 5 hours and 30 daytime minutes), in Golden, Colo. Continuous temperature readings were made on the air above the instrument panel using a type-K (chromel-alumel) radiation shielded thermocouple. As shown in FIG. 7, data was plotted as a function of test time 700, breath level temperature 702 and solar intensity 704. A solar track 706 indicates the day time solar intensity, and data plots 708 and 710 indicate the breath level temperature above the instrument panel for the portion of the panel having heat pipes and the portion of the instrument panel not having heat pipes, respectively.

Figure 7:
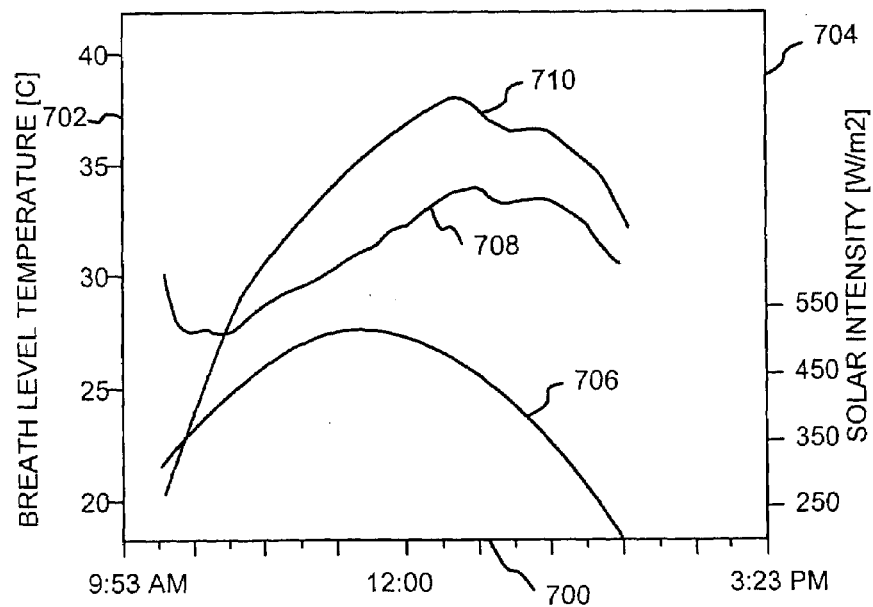
FIG. 7 graphical illustrates the passenger compartment air temperature difference when a vehicle has an instrument panel and when a vehicle has an instrument panel incorporating an embodiment of the passive heat transfer system of the present invention.

Results:

As shown in FIG. 7, the air temperature in the passenger compartment is about 4_C. lower over the portion of the instrument panel having heat pipes as compared to the portion of the instrument panel having no heat pipes.

The data illustrates the passive cooling properties that the heat pipes have on the thermal environment of a vehicle over the course of a day. These effects are significant when one takes into account that every degree F. reduction in air temperature of the passenger compartment results in an approximate 4% reduction in compressor power, i.e., air conditioning energy required to lower that volume of air one degree F. A 4° C. (7.2° F.) decrease in air temperature represents a 28.8% reduction in required compressor power, indicating that embodiments of the invention have significant effects on reducing the amount of energy required by the compressor to cool down the passenger compartment of a vehicle, resulting in an increase in vehicle fuel economy and a decrease in a vehicle's emissions.

It will be clear that the present invention is well adapted to attain the ends and advantages mentioned as well as those inherent therein. While a presently preferred embodiment has been described for purposes of this disclosure, numerous changes may be made which will readily suggest themselves to those skilled in the art. Accordingly, all such modifications, changes and alternatives are encompassed in the spirit of the invention disclosed and as defined in the appended claims.

What is claimed is:

1. A passive cooling system for removing heat from a component located within a passenger compartment of a vehicle, the vehicle having an external portion, the passive cooling system comprising:
   a heat pipe within the component, the heat pipe communicating between the component and the external portion of the vehicle, the heat pipe containing a liquid, the heat pipe having an evaporator section at least partially embedded within the component in abutting contact with one or more surfaces of the component such that all or substantially all heat transfer between the evaporator section and the component surfaces is conductive heat transfer and a condenser section located at the external portion of the vehicle such that when a temperature at the evaporator section is greater than a temperature at the condenser section, heat is passively transferred from the component to the external portion of the vehicle.

2. The passive cooling system of claim 1 wherein the component is an instrument panel.

3. The passive cooling system of claim 2 wherein the instrument panel has an outer layer composed of a thermoplastic polymer and wherein the evaporator section of the heat pipe is thermally connected to the thermoplastic layer.

4. The passive cooling system of claim 3 further comprising a plurality of heat pipes.

5. The passive cooling system of claim 3 wherein the thermoplastic polymer is polyvinyl chloride.

6. The passive cooling system of claim 3 further comprising a thermally conductive film wherein the evaporator section of the heat pipe is thermally connected to the thermally conductive film and the thermally conductive film is embedded in the thermoplastic layer of the instrument panel.

7. The passive cooling system of claim 6 wherein the heat pipe is attached to the thermally conductive film and the film is adhered to the thermoplastic layer of the instrument panel.

8. The passive cooling system of claim 6 wherein the thermally conductive film is a metal selected from the group consisting of copper, molybdenum, gold, nickel, stainless steel, niobium, cobalt, chromium, beryllium, magnesium, platinum, iridium, bronze, silver, tin, titanium, iron, tungsten, zinc and tantalum.

9. The passive cooling system of claim 6 wherein the thermally conductive film is a ceramic material selected from the group consisting of silicon carbide, alumina and aluminum nitride.

10. The passive cooling system of claim 6 wherein the thermally conductive film is a carbon-based material selected from the group consisting of a carbon-fiber composite, carbon foam material and diamond.

11. The passive cooling system of claim 7 further comprising a bracket for accepting the heat pipe wherein the bracket is attached to the thermally conductive film.

12. The passive cooling system of claim 1, wherein the external portion comprises a substantially vertical side panel of the vehicle and wherein the condenser section is mounted to an interior surface of the side panel.

13. The passive cooling system of claim 12, wherein the condenser section is mounted lower within the vehicle than the evaporator section and wherein a lowest portion of the condenser section is less than about 1 vertical foot from a lowest portion of the evaporator section.

14. A passive cooling system for an instrument panel in a vehicle, the passive cooling system comprising:
   a heat pipe having an evaporator section in communication with a condenser section, the evaporator section embedded in the instrument panel; and
   an external portion of the vehicle at a temperature lower than the temperature of the instrument panel, wherein solar heat absorbed at the instrument panel is transferred to the evaporator section of the heat pipe, onto the condenser section of the heat pipe and dissipated to the external portion of the vehicle;
   wherein the heat pipe further comprises a closable valve for substantially thermally disconnecting the evaporator section of the heat pipe from the condenser section of the heat pipe;
   wherein solar heat absorbed at the instrument panel is at least partially trapped in the evaporator section of the heat pipe when the valve is in a closed position; and
   wherein the valve is triggered to close or open by a manual switch.

15. The passive cooling system of claim 14 wherein the instrument panel has an outer layer composed of a thermoplastic polymer and wherein the heat pipe is embedded in or adjacent to the outer thermoplastic polymer layer.

16. The passive cooling system of claim 15 further comprising a thermally conductive film wherein the evaporator section of the heat pipe is thermally connected to the film and the film is embedded in the thermal plastic polymer layer of the instrument panel.

17. The passive cooling system of claim 16 further comprising a bracket attached to the thermally conductive film for accepting the heat pipe, wherein the thermally conductive film is adhered to the thermoplastic polymer layer of the instrument panel.

18. The passive cooling system of system of claim 17 further comprising a thermally conductive grease for coating the heat pipe, wherein the thermally conductive grease facilitates the transfer of heat from the bracket to the heat pipe.

19. The passive cooling system of claim 14 wherein the external portion of the vehicle is a side body panel.

20. The passive cooling system of claim 14 wherein the external portion of the vehicle is a roof.

21. The passive cooling system of claim 14 wherein the heat pipe is further defined as comprising copper and as containing water suitable for transferring the solar heat absorbed at the instrument panel to the external portion of the vehicle.

22. The passive cooling system of claim 14 wherein the valve is triggered to close at a preset instrument panel temperature.

23. The passive cooling system of claim 14 further comprising a passenger compartment within the vehicle, wherein the valve is triggered to close at a preset air temperature within the passenger compartment.

24. The passive cooling system of claim 14 wherein the instrument panel has an inner layer composed of polyurethane and wherein the heat pipe is embedded in or adjacent to the inner polyurethane layer.

25. The passive cooling system of claim 14 wherein the instrument panel has an inner layer composed of a thermoplastic polymer and wherein the heat pipe is embedded in or adjacent to the inner thermoplastic polymer layer.

26. A method for passively controlling the temperature of an instrument panel in a vehicle, the method comprising:
   obtaining a heat pipe having an evaporator section in communication with a condenser section;
   embedding the evaporator section of the heat pipe in the instrument panel, wherein the evaporator section is at least partially in heat transfer contact with at least one surface of the instrument panel;
   securing the condenser section of the heat pipe to an external portion of the vehicle; and
   providing one or more valves for blocking flow between the evaporator and condenser sections of the heat pipe, wherein the valves are switch operable to be substantially fully closed or opened based on one or more sensed temperatures.

27. The method of claim 26 wherein the instrument panel has an outer layer composed of a thermoplastic polymer and the embedding of the evaporator section of the heat pipe in the instrument panel further comprises: connecting the evaporator section of the heat pipe to a thermally conductive film and adhering the film to the thermoplastic polymer layer of the instrument panel.

28. A cooling system for an instrument panel in a vehicle, the passive cooling system comprising:
   a portion of the vehicle at a lower temperature than the instrument panel; and
   means for passively removing heat from the instrument panel to the external portion of the vehicle;
   wherein the passive heat removal means comprises a plurality of heat pipes with evaporator sections in conductive heat transfer contact with at least one surface of the instrument panel and condenser sections mounted proximal to the portion of the vehicle at the lower temperature; and
   wherein the passive heat removal means comprises one or more valves for blocking flow between the evaporator and condenser sections of the heat pipes, the one or more valves being substantially fully closed or opened by an automated controller based on one or more sensed temperatures of by a manual switch.

* * * * *